(12) United States Patent
Furuya

(10) Patent No.: US 12,106,949 B2
(45) Date of Patent: Oct. 1, 2024

(54) SPUTTERING TARGET AND METHOD FOR MANUFACTURING SPUTTERING TARGET

(71) Applicant: JX Nippon Mining & Metals Corporation, Tokyo (JP)

(72) Inventor: Yuki Furuya, Ibaraki (JP)

(73) Assignee: JX Advanced Metals Corporation, Tokyo (JP)

( * ) Notice: Subject to any disclaimer, the term of this patent is extended or adjusted under 35 U.S.C. 154(b) by 289 days.

(21) Appl. No.: 17/598,473

(22) PCT Filed: Sep. 20, 2019

(86) PCT No.: PCT/JP2019/037143
§ 371 (c)(1),
(2) Date: Sep. 27, 2021

(87) PCT Pub. No.: WO2020/202604
PCT Pub. Date: Oct. 8, 2020

(65) Prior Publication Data
US 2022/0189750 A1  Jun. 16, 2022

(30) Foreign Application Priority Data
Mar. 29, 2019  (JP) ................. 2019-069393

(51) Int. Cl.
*H01J 37/34* (2006.01)
*B22F 3/10* (2006.01)
(Continued)

(52) U.S. Cl.
CPC ............ *H01J 37/3429* (2013.01); *B22F 3/10* (2013.01); *C22C 5/04* (2013.01); *C22C 19/07* (2013.01); *C22C 30/00* (2013.01); *C22C 32/0015* (2013.01); *C23C 14/3414* (2013.01); *B22F 2301/15* (2013.01); *B22F 2301/25* (2013.01); *C22C 2202/02* (2013.01)

(58) Field of Classification Search
CPC .... H01J 37/3429; C23C 14/3414; C22C 5/04; C22C 19/07; C22C 30/00; C22C 32/0015; C22C 32/0026; C22C 2202/02; C22C 1/05; B22F 3/10; B22F 2301/15; B22F 2301/25; B22F 2998/10; C04B 35/00
USPC ............... 204/298.12, 298.13; 420/435–439; 419/12, 19, 49
See application file for complete search history.

(56) References Cited

U.S. PATENT DOCUMENTS

2010/0128390 A1  5/2010  Tanaka

FOREIGN PATENT DOCUMENTS

| JP | 2010-118115 A | 5/2010 |
|---|---|---|
| JP | 2012-117147 A | 6/2012 |
| JP | 5878242 B2 | 3/2016 |

OTHER PUBLICATIONS

International Search Report mailed Oct. 29, 2019 in corresponding PCT application No. PCT/JP2019/037143.
(Continued)

*Primary Examiner* — Rodney G McDonald
(74) *Attorney, Agent, or Firm* — NIELDS, LEMACK & FRAME, LLC

(57) ABSTRACT

Provided is a sputtering target capable of reducing generation of particles, and a method for producing the same. The sputtering target includes: 10 mol % or more and 85 mol % or less of Co, 0 mol % or more and 47 mol % or less of Pt, and 0 mol % or more and 47 mol % or less of Cr, as metal components; and at least $B_6O$ as an oxide component.

9 Claims, 2 Drawing Sheets

(51) Int. Cl.
      *C22C 5/04*           (2006.01)
      *C22C 19/07*         (2006.01)
      *C22C 30/00*         (2006.01)
      *C22C 32/00*         (2006.01)
      *C23C 14/34*         (2006.01)

(56) References Cited

OTHER PUBLICATIONS

International Preliminary Report on Patentability issued Sep. 30, 2021 in corresponding PCT application No. PCT/JP2019/037143.

SPUTTERING TARGET AND METHOD FOR MANUFACTURING SPUTTERING TARGET

FIELD OF THE INVENTION

The present invention relates to a sputtering target and a method for manufacturing a sputtering target.

BACKGROUND OF THE INVENTION

In a field of magnetic recording represented by hard disk drives, a material based on Co which is a ferromagnetic metal has been used as a material for a magnetic thin film responsible for recording. In sputtering targets for magnetic recording, composite materials composed of ferromagnetic alloys and non-magnetic materials are often used and sputtering targets with boron oxide added as a non-magnetic material are known in the art.

For example, Japanese Patent No. 5878242 B (Patent Literature 1) describes an example of a sputtering target for forming magnetic recording films composed of a sintered body which includes at least cobalt as a metal and one or more metals or alloys selected from boron and/or platinum group elements, and an oxide, wherein at least one or more of $Cr(BO_3)$, $Co_2B_2O_5$, and $Co_3B_2O_6$ is present in phases comprising the oxide. A boron-containing sputtering target having higher quality and production efficiency can be obtained by sintering with the composite oxide such as $Cr(BO_3)$.

CITATION LIST

Patent Literatures

[Patent Literature 1] Japanese Patent No. 5878242 B

SUMMARY OF THE INVENTION

Technical Problem

The sputtering targets to which boron oxide is added as a non-magnetic material may have a problem that sizes of boron oxide grains are increased after sintering, and a decrease in a sintering temperature in order to suppress grain growth prevents an increase in density, generating many particles.

For example, $B_2O_3$ that is one of the non-magnetic materials has a lower melting point. Therefore, if the $B_2O_3$ raw material is used as it is, the density may not be sufficiently increased when it is sintered below the melting point, which causes an increased risk of generating a larger amount of particles. However, when it is sintered above the melting point, the $B_2O_3$ is melted during sintering, causing any uneven composition, and coarse particles are formed, resulting in a larger amount of particles, which makes it difficult to obtain a stable sputtering target having a higher quality.

On the other hand, for example, Patent Literature 1 uses the composite oxide having a higher melting point such as $Cr(BO_3)$, $Co_2B_2O_5$, and $Co_3B_2O_6$ to increase the sintering temperature, thereby improving the density and suppressing the generation of the particles during sputtering. However, for example, the use of $Co_2B_2O_5$ or $Co_3B_2O_6$ for producing Co—Pt—$B_2O_3$—$SiO_2$ leads to the use of a metal B, and depending on the sintering conditions, the metal B and $SiO_2$ may react with each other to generate larger grains, and the use of the resulting sintered body as a target may generate a larger amount of particles. The reaction of the metal B with oxides may also occur even in the case of oxides other than $SiO_2$.

In view of the above problems, the present disclosure provides a sputtering target capable of reducing generation of particles, and a method for producing the same.

Solution to Problem

In one aspect, a sputtering target according to an embodiment of the present invention which includes a sputtering target including 10 mol % or more and 85 mol % or less of Co, 0 mol % or more and 47 mol % or less of Pt, and 0 mol % or more and 47 mol % or less of Cr, as metal components; and at least $B_6O$ as an oxide component.

Advantageous Effects of Invention

According to the present disclosure, it is possible to provide a sputtering target capable of reducing generation of particles, and a method for producing the same.

DETAILED DESCRIPTION OF THE INVENTION

Figure 1:
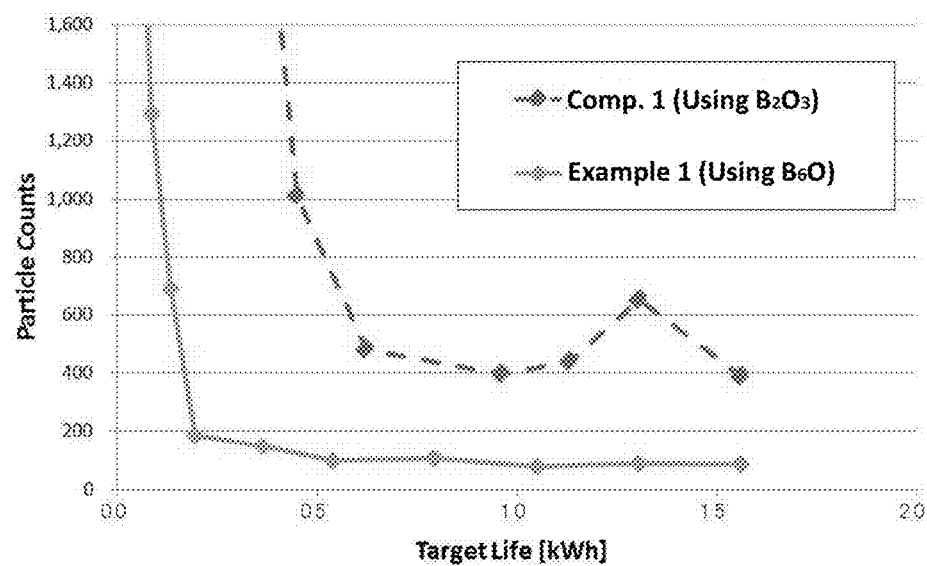
FIG. 1 is a graph showing particle evaluation results in Example 1 and Comparative Example 1.

A sputtering target according to an embodiment of the present invention includes metal phases composed of a metal component(s) forming a target base (matrix) portion; and oxide phases composed of an oxide component(s).

(Metal Phase)

The composition of Pt and Co as the metallic components of the target base (matrix) is mainly determined by magnetic performance required for magnetic recording layers. The lower limit of the Pt content in the target base may be 5 mol %, and the lower limit of the Co content may be 55 mol %. If those contents are lower than those lower limits, the magnetization characteristics generally required for magnetic recording layers in vertical magnetic recording systems cannot be obtained. A desirable composition range for Pt in the target base may be 10 mol % or more, and even more preferably 15 mol % or more. A desirable composition range for Co may be 60 mol % or more.

On the other hand, the upper limits of Pt and Co in the target base may be 45 mol % and 95 mol %, respectively. Even if those contents are lower than those upper limits, any magnetization characteristics generally required for the magnetic recording layers in the perpendicular magnetic recording systems cannot be obtained. A desirable composition range for Pt may be 40 mol % or less, and more preferably 30 mol % or less. A desirable composition range for Co may be 85 mol % or less, and more preferably 75 mol % or less.

Further, Cr may optionally be contained as the metal component forming the matrix, depending on the magnetic performance of the magnetic recording layer. A desirable composition range for Cr in the target base may be 40 mol % or less, and a more desirable range may be 20 mol % or less of the matrix metal component, and further preferably 10 mol % or less.

(Oxide Phase)

As the oxide components, oxides of one or more selected from the group consisting of Cr, Ta, Ti, Si, Zr, Al, Nb, B, and Co may be contained, depending on the magnetic performance of the magnetic recording layer. A volume ratio of the total oxide component to the total sputtering target is preferably 1 mol % or more and 20 mol % or less, and even more preferably 3 mol % or more and 15 mol % or less, and even more preferably 5 mol % or more and 10 mol % or less.

As additive elements, additive element components selected from the group consisting of B, N, Ti, V, Mn, Zr, Nb, Ru, Mo, Ta, W, Si and Al may be contained in the total amount of 35 mol % or less, and preferably 20 mol % or less, and even more preferably 10 mol % or less.

(Total Composition of Sputtering Target)

The sputtering target according to an embodiment of the present invention contains: from 10 mol % to 85 mol % of Co, from 0 mol % to 47 mol % of Pt, and from 0 mol % to 47 mol % of Cr as metallic components; and at least $B_6O$ as an oxide component.

The Co is preferably contained in an amount of from 20 to 60 mol %, and more preferably from 30 to 50 mol %. The Pt is preferably contained in an amount of from 10 to 40 mol %, and more preferably from 20 to 30 mol %. The Cr is preferably contained in an amount of from 5 to 30 mol %, and more preferably 10 to 20 mol %.

The $B_6O$ may be contained in the sputtering target in an amount of 0.1 mol % or more and 10 mol % or less. The $B_6O$ may more preferably be contained in the sputtering target in an amount of 0.3 mol % or more and 4.0 mol % or less.

The presence of $B_6O$ can also be confirmed by XRD diffraction of a sample of the sintered body. More particularly, The XRD diffraction indicates a diffraction peak of $B_6O$ (110) in the range of $2\theta=30$ to $35°$ and a diffraction peak of $B_6O$ (104) in the range of $2\theta=35$ to $40°$ in the XRD diffraction pattern using Cu as a X-ray source.

Furthermore, a half-value width of the diffraction peak for $B_6O$ (110) in the range of $2\theta=30$ to $35°$ is 0.5 deg or more, and even 0.6 deg or more, and typically from 0.5 to 0.8 deg. A half-value width of the diffraction peak for $B_6O$ (104) in the range of $2\theta=35$ to $40°$ is 0.5 deg or more, and even 0.6 deg or more, and typically from 0.6 to 1.0 deg.

The sputtering target according to an embodiment of the present invention has an amount of B eluted of 1000 $\mu g/L/cm^2$ or less. The amount of B eluted amount refers to B concentration in leached solution, obtained by immersing the sputtering target in water at ordinary temperature, a volume of which is such that $B_2O_3$ is not saturated, and measuring the B concentration by an inductively coupled plasma (ICP) device. The amount of B eluted is preferably 700 $\mu g/L/cm^2$ or less, and more preferably 500 $\mu g/L/cm^2$ or less, and even more preferably 300 $\mu g/L/cm^2$ or less. When the amount of B eluted is lower, it is effective in inhibiting the alteration of the target surface due to the dissolution of boron oxide in water or atmospheric moisture when the water or moisture adheres to the target surface.

The sputtering target according to the embodiment of the present invention can be produced by using a sintered powder method. That is, the method for producing the sputtering target according to the embodiment of the present invention includes: preparing 10 mol % or more and 85 mol % or less of Co, 0 mol % or more and 47 mol % or less of Pt, and 0 mol % or more and 47 mol % or less of Cr as metal powder; adding $B_6O$ in the form of oxide powder to the metal powder to mix them; and sintering the mixed powder. The $B_6O$ is preferably added in an amount of 0.1 mol % or more and 10 mol % or less, and more preferably 0.3 mol % or more and 4.0 mol % or less.

For each of the Co powder, Pt powder, Cr powder, and $B_6O$ powder, it is preferable to use powder having an average grain diameter of 3 $\mu m$ or less. The average grain diameter of the powder refers to a median diameter measured by the laser diffraction scattering method.

The metal powder and the oxide powder can be mixed using a known technique such as sieve mixing and mortar mixing, which also involves grinding. The resulting mixed powder is compacted and sintered in a vacuum or inert gas atmosphere using the hot press method.

In the sintering process, the heating is carried out under a temperature condition where a sintering temperature is from 700° C. to 1200° C. or lower in order to improve the relative density. If the sintering temperature is too low, the density may not increase sufficiently.

According to the sputtering target and the method for producing the same of the embodiment of the present invention, it is possible to produce a sputtering target containing $B_6O$ as a sputtering target with boron oxide added as a non-magnetic material, whereby the generation of particles can be reduced as compared with the case where a material such as $B_2O_3$, which melts at a lower temperature, is used.

While the present disclosure has been described by means of the above embodiments, the descriptions and drawings that form a part of this disclosure should not be understood as limiting the invention. That is, the present invention is not limited to each embodiment, and it can be embodied by modifying the components without departing from the spirit of the present invention. Also, various inventions may be formed by appropriate combinations of a plurality of components disclosed in each embodiment. For example, some components may be deleted from all the components set forth in the embodiments. Furthermore, the components of different embodiments may optionally be combined.

EXAMPLES

Examples of the present invention are provided below together with Comparative Examples. These Examples are provided for better understanding of the present invention and its advantages, and are not intended to limit the invention.

Example 1 and Comparative Example 1

Each material powder was weighed and mixed so as to have a composition of Co-7.7Pt-7.7B-3.8Ti-19.2O at %, and the resulting mixed powder was hot-pressed in a vacuum atmosphere at each sintering temperature as shown in Table 1 and under a pressure of 20 MPa for 5 hours to prepare sintered bodies according to Example 1 and Comparative Example 1. In Example 1, $B_6O$ powder having an average particle diameter of 3 $\mu m$ was used, and in Comparative Example 1, $B_2O_3$ powder having an average particle diameter of 3 $\mu m$ was used. Each of the prepared sintered bodies according to Example 1 and Comparative Example 1 was processed into a target shape, and the number of particles generated when carrying out sputtering was evaluated. A magnetron sputtering apparatus (C-3010 sputtering system from CANON ANELVA CORPORATION) was used for the evaluation. The sputtering was carried out under conditions of an input power of 0.5 kW and an Ar gas pressure of 1.7 Pa to form a film on a silicon substrate for 40 seconds.

The number of particles (a particle diameter of from 0.09 to 3 μm) adhering onto the substrate was measured with a particle counter (from KLA-Tencor; device name: Candela CS920). The results are shown in FIG. 1. In Comparative Example 1, the number of particles was about 500, whereas in Example 1, the number of particles was about 100, indicating that the target according to Example 1 using $B_6O$ powder effectively reduced the number of particles as compared with the target according to Comparative Example 1, and had improved sputtering characteristics.

Examples 2 to 10 and Comparative Examples 2 to 9

Each material powder shown in Table 1 was weighed and mixed so as to have each composition shown in Table 1, and the resulting mixed powder was hot-pressed in a vacuum atmosphere at each sintering temperature as shown in Table 1 and under a pressure of 20 MPa for 5 hours to prepare sintered bodies according to Examples 2 to 10 and Comparative Examples 2 to 9. In Examples 2 to 10, $B_6O$ powder having an average particle diameter of 3 μm was used, and in Comparative Examples 2 to 9, $B_2O_3$ powder having an average particle diameter of 3 μm was used.

The presence or absence of the XRD diffraction peak of $B_6O$ was confirmed for each of the sintered bodies according to Examples 1 to 10 and Comparative Examples 1 to 9. The XRD measurement conditions were as follows:

Analyzer: X-ray diffractometer (in Examples, a full automatic horizontal multipurpose X-ray diffractometer SmartLab from Rigaku Co., Ltd. was used);
Tube: Cu (measured with CuKα);
Tube voltage: 40 kV;
Tube current: 30 mA;
Optical system: Concentrated diffraction optical system;
Scan mode: 2θ/θ;
Scanning range (2θ): 30° to 55°;
Measurement step (2θ): 0.02°;
Scan speed (2θ): 0.5° per minute;
Attachment: Standard attachment;
Filter: CuKβ filter;
Counter monochrome: None;
Counter: D/teX Ultra;
Divergence slit: ⅔ deg.;
Divergence vertical slit: 10.0 mm;
Scattering slit: 10.0 mm;
Light receiving slit: 10.0 mm; and
Attenuator: OPEN.

Whether or not the XRD diffraction pattern had a diffraction peak of $B_6O$ (110) in the range of 2θ=30 to 35° and a diffraction peak of $B_6O$ (104) in the range of 2θ=35 to 40° was confirmed. In Examples 1 to 11, the diffraction peaks of $B_6O$ (110) and $B_6O$ (104) also appeared in the sintered bodies. The results are shown in Table 1. The composition and the ratio of raw materials used in Table 1 show the results obtained by rounding off to the first decimal place.

TABLE 1

| | Composition (at %) | Raw Material Ratio (mol %) |
|---|---|---|
| Example 1 | Co—7.7Pt—7.7B—3.8Ti—19.2O | Co—10.3Pt—1.7$B_6O$—5.2$SiO_2$—13.8CoO |
| Comparative Example 1 | | Co—10Pt—5$B_2O_3$—5$SiO_2$ |
| Example 2 | Co—34.6Cr—7.7B—3.8Ti—19.2O | Co—46.6Cr—1.7$B_6O$—5.2$TiO_2$—13.8CoO |
| Comparative Example 2 | | Co—45Cr—5$B_2O_3$—5$TiO_2$ |
| Example 3 | Co—34.6Pt—7.7B—3.8Ti—19.2O | Co—46.6Pt—1.7$B_6O$—5.2$SiO_2$—13.8CoO |
| Comparative Example 3 | | Co—45Pt—5$B_2O_3$—5$SiO_2$ |
| Example 4 | Co—10.3Pt—13.8B—24.1O | Co—16.1Pt—3.6$B_6O$—33.9CoO |
| Comparative Example 4 | | Co—15Pt—10$B_2O_3$—5CoO |
| Example 5 | Co—25B—37.5O | Co—10$B_6O$—80CoO |
| Comparative Example 5 | | Co—25$B_2O_3$ |
| Example 6 | Co—6.5Cr—9.7Pt—6.5B—3.2Ti—3.2Si—29.0O | Co—15.5Pt—1.7$B_6O$—5.2$TiO_2$—5.2$SiO_2$—5.2$Cr_2O_3$—13.8CoO |
| Comparative Example 6 | | Co—15Pt—5$B_2O_3$—5$TiO_2$—5$SiO_2$—5$Cr_2O_3$ |
| Example 7 | Co—16.1Cr—9.7Pt—6.5B—3.2Ti—3.2Si—29.0O | Co—15.5Cr—15.5Pt—1.7$B_6O$—5.2$TiO_2$—5.2$SiO_2$—5.2$Cr_2O_3$—13.8CoO |
| Example 8 | | Co—15.5Cr—15.5Pt—1.7$B_6O$—5.2$TiO_2$—5.2$SiO_2$—5.2$Cr_2O_3$—13.8CoO |
| Comparative Example 7 | | Co—15Cr—15Pt—5$B_2O_3$—5$TiO_2$—5$SiO_2$—5$Cr_2O_3$ |
| Example 9 | Co—30.8Ru—1.9B—2.9O | Co—32.2Ru—0.3$B_6O$—2.7CoO |
| Comparative Example 8 | | Co—32Ru—1$B_2O_3$ |
| Example 10 | Co—8.3B—12.5O | Co—1.7$B_6O$—13.8CoO |
| Comparative Example 9 | | Co—5$B_2O_3$ |

| | Sintering Temperature (° C.) | $B_6O$ (XRD Peak Determination) | Amount of B Eluted (μg/L/cm²) |
|---|---|---|---|
| Example 1 | 900 | Yes | 420 |
| Comparative Example 1 | 450 | No | 1400 |
| Example 2 | 900 | Yes | 200 |
| Comparative Example 2 | 450 | No | 1300 |
| Example 3 | 900 | Yes | 170 |
| Comparative Example 3 | 450 | No | 1250 |

TABLE 1-continued

| | | | |
|---|---|---|---|
| Example 4 | 900 | Yes | 150 |
| Comparative Example 4 | 450 | No | 1480 |
| Example 5 | 700 | Yes | 580 |
| Comparative Example 5 | 450 | No | 1600 |
| Example 6 | 900 | Yes | 170 |
| Comparative Example 6 | 450 | No | 1250 |
| Example 7 | 900 | Yes | 270 |
| Example 8 | 1200 | Yes | 980 |
| Comparative Example 7 | 450 | No | 1280 |
| Example 9 | 1000 | Yes | 110 |
| Comparative Example 8 | 450 | No | 1050 |
| Example 10 | 900 | Yes | 300 |
| Comparative Example 9 | 450 | No | 1180 |

Figure 2:
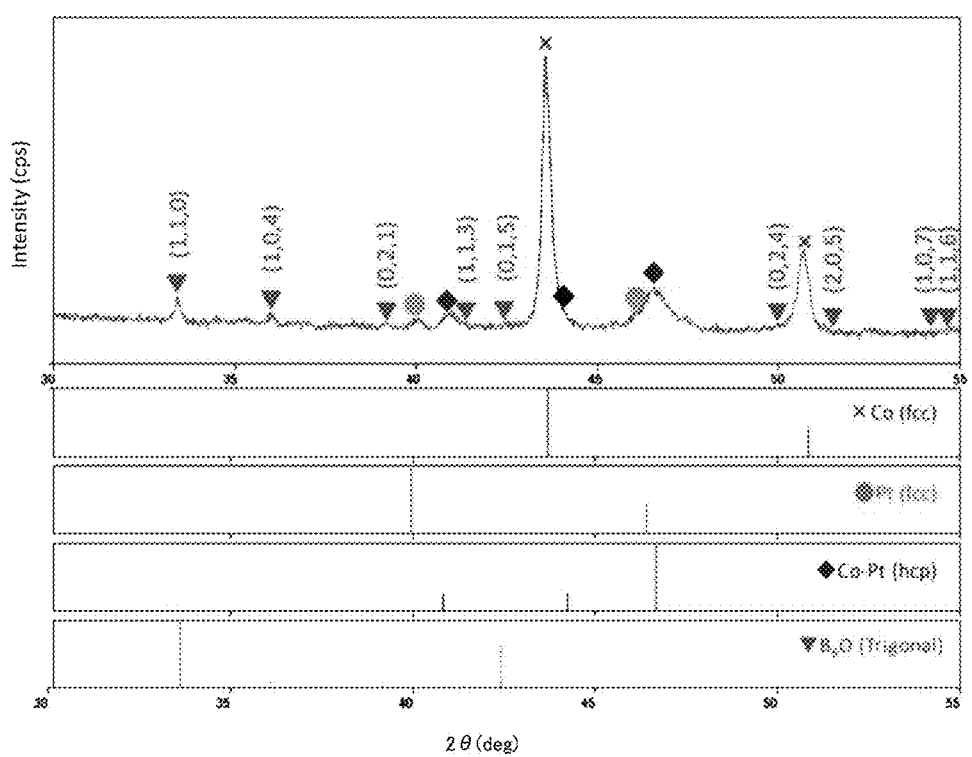
FIG. 2 is a graph showing XRD measurement results in Example 4.

A graph showing the diffraction peak of XRD in Example 4 is shown in FIG. 2. As shown in FIG. 2, the sintered body according to Example 4 had the diffraction peak of $B_6O$ (110) in the range of $2\theta=30$ to $35°$ and the diffraction peak of $B_6O$ (104) in the range of $2\theta=35$ to $40°$ in the XRD diffraction pattern, which had half-value widths in the ranges of from 0.5 to 0.8 deg and from 0.6 to 1.0 deg, respectively.

The amount of B eluted (the amount of boron dissolved in water) was measured for the sintered bodies according to Examples 1 to 10 and Comparative Examples 1 to 9. The amount of B eluted was measured as follows. First, a sample having 3 mm×3 mm×20 mm was prepared from each sintered body (whose surface was dry-processed). It was noted that the surface of the sample was in a dry-polished state and was not in contact with any solvent such as water and ethanol. The sample was then immersed in 50 to 100 cc of water at ordinary temperature. Since the solubility of $B_2O_3$ is 0.028 g/cc, if water is 50 cc or more, $B_2O_3$ is not saturated, but if water is more than 100 cc, the B concentration is decreased, leading to difficult analysis. By using ICP (SPS 3500 DD from Hitachi High-Tech Science Corporation), the amount of boron eluted was measured for the water in which the sample was immersed, and the measured weight of B in the eluted water was divided by the volume of the eluted water and the sample surface area. The resulting value was determined to be the amount of B eluted. The amount of B eluted was 1000 µg/L/cm² or less for Examples 1 to 10 where the diffraction peak of $B_6O$ was observed in XRD, and 1000 µg/L/cm² or more for Comparative Examples 1 to 9 where the diffraction peak of $B_6O$ was not observed in XRD.

The invention claimed is:

1. A sputtering target comprising:
   10 mol % or more and 85 mol % or less of Co, 0 mol % or more and 47 mol % or less of Pt, and 0 mol % or more and 47 mol % or less of Cr, as metal components; and
   at least $B_6O$ as an oxide component; wherein an amount of B eluted is 500 µg/L/cm² or less,
   and wherein the sputtering target has a diffraction peak of $B_6O$ (110) in a range of $2\theta=30$ to $35°$ and a diffraction peak of $B_6O$ (104) in a range of $2\theta=35$ to $40°$ in an XRD diffraction pattern using Cu as a radiation source.

2. The sputtering target according to claim 1, wherein $B_6O$ is contained an amount of 0.1 mol % or more and 10 mol % or less.

3. The sputtering target according to claim 1, comprising an oxide of at least one selected from the group consisting of Cr, Ta, Ti, Si, Zr, Al, Nb, B and Co as an oxide component, and wherein a volume ratio of the total oxide to the total sputtering target is 1 mol % or more and 20 mol % or less.

4. The sputtering target according to claim 1, comprising an additive element component selected from the group consisting of B, N, Ti, V, Mn, Zr, Nb, Ru, Mo, Ta, W, Si and Al in a total amount of 35 mol % or less.

5. The sputtering target according to claim 2, comprising an oxide of at least one selected from the group consisting of Cr, Ta, Ti, Si, Zr, Al, Nb, B and Co as an oxide component, and wherein a volume ratio of the total oxide to the total sputtering target is 1 mol % or more and 20 mol % or less.

6. The sputtering target according to claim 2, comprising an additive element component selected from the group consisting of B, N, Ti, V, Mn, Zr, Nb, Ru, Mo, Ta, W, Si and Al in a total amount of 35 mol % or less.

7. The sputtering target according to claim 3, comprising an additive element component selected from the group consisting of B, N, Ti, V, Mn, Zr, Nb, Ru, Mo, Ta, W, Si and Al in a total amount of 35 mol % or less.

8. The sputtering target according to claim 1, wherein the sputtering target has a half-value width of the diffraction peak for $B_6O$ (110) in a range of $2\theta=30$ to $35°$ of 0.5 deg or more, and a half-value width of the diffraction peak for $B_6O$ (104) in a range of $2\theta=35$ to $40°$ of 0.5 deg or more in an XRD diffraction pattern using Cu as a radiation source.

9. A method for producing a sputtering target comprising:
   preparing 10 mol % or more and 85 mol % or less of Co, 0 mol % or more and 47 mol % or less of Pt, and 0 mol % or more and 47 mol % or less of Cr as metal powder;
   adding $B_6O$ in the form of oxide powder to the metal powder to mix them; and
   sintering the mixed powder at a sintering temperature of 900° C. to 1200° C. to produce a sputtering target in which an amount of B eluted is 500 µg/L/cm² or less and having a diffraction peak of $B_6O$ (110) in a range of $2\theta=30$ to $35°$ and a diffraction peak of $B_6O$ (104) in a range of $2\theta=35$ to $40°$ in an XRD diffraction pattern using Cu as a radiation source.

* * * * *